United States Patent [19]

Yoder et al.

[11] 4,045,636

[45] Aug. 30, 1977

[54] KEYBOARD SWITCH ASSEMBLY HAVING PRINTED CIRCUIT BOARD WITH PLURAL LAYER EXPOSED CONTACTS AND UNDERSURFACE JUMPER CONNECTIONS

[75] Inventors: Alan C. Yoder; John E. Weber, both of Fort Wayne, Ind.

[73] Assignee: Bowmar Instrument Corporation, Fort Wayne, Ind.

[21] Appl. No.: 653,226

[22] Filed: Jan. 28, 1976

[51] Int. Cl.² .................. H01H 9/00; H05K 1/00
[52] U.S. Cl. ........................ 200/292; 174/68.5;
200/5 A; 200/159 B; 200/262; 200/267;
200/270; 361/397; 428/901
[58] Field of Search ............ 200/5 R, 5 A, 159 B,
200/262–270, 284, 292; 174/68.5; 317/101 B,
101 CC, 101 CE; 29/625; 427/96; 428/901;
361/397, 400, 402, 409, 410, 411, 414, 416

[56] References Cited

U.S. PATENT DOCUMENTS

| 2,866,764 | 12/1958 | West et al. ................. 427/96 X |
| 3,030,237 | 4/1962 | Price ........................ 428/901 X |
| 3,622,384 | 11/1971 | Davey et al. ............... 428/901 X |
| 3,652,332 | 3/1972 | Brand et al. .................... 427/96 |
| 3,721,778 | 3/1973 | Seeger, et al. ............. 200/159 BX |
| 3,723,176 | 3/1973 | Theobald et al. ......... 174/68.5 UX |
| 3,796,843 | 3/1974 | Durkee et al. ............ 200/159 B X |
| 3,806,685 | 4/1974 | Seeger, Jr. et al. ........ 200/159 B X |
| 3,860,771 | 1/1975 | Lynn et al. ................ 200/159 B X |
| 3,862,381 | 1/1975 | Glaister et al. ............ 200/159 B X |
| 3,862,382 | 1/1975 | Glaister et al. ............ 200/159 B X |
| 3,912,442 | 10/1975 | Cote ............................. 174/68.5 X |
| 3,912,852 | 10/1975 | Simon ............................. 174/68.5 |
| 3,996,430 | 12/1976 | Eberwein et al. .......... 200/159 A X |

*Primary Examiner*—James R. Scott
*Attorney, Agent, or Firm*—Gust, Irish, Jeffers & Rickert

[57] ABSTRACT

A printed wiring board for a keyboard switch assembly for electronic apparatus, such as electronic calculators, comprising a self-supporting insulative board having a plurality of elongated connectors on one surface thereof, at least some of the conductors having terminal portions for cooperating with switch elements. A layer of insulating material covers the one surface of the board and the conductors excluding the terminal portions. Each of the terminal portions has a coating of conductive ink thereon and a jumper element also formed of conductive ink is coated on the insulating layer crossing at least one of the conductors embedded therein and joining at least two of the terminal portion coatings. The conductive ink is preferably a noble-metal filled resin compound, such as silver epoxy, screen printed onto the insulating layer and terminal portions.

11 Claims, 7 Drawing Figures

Fig. 3
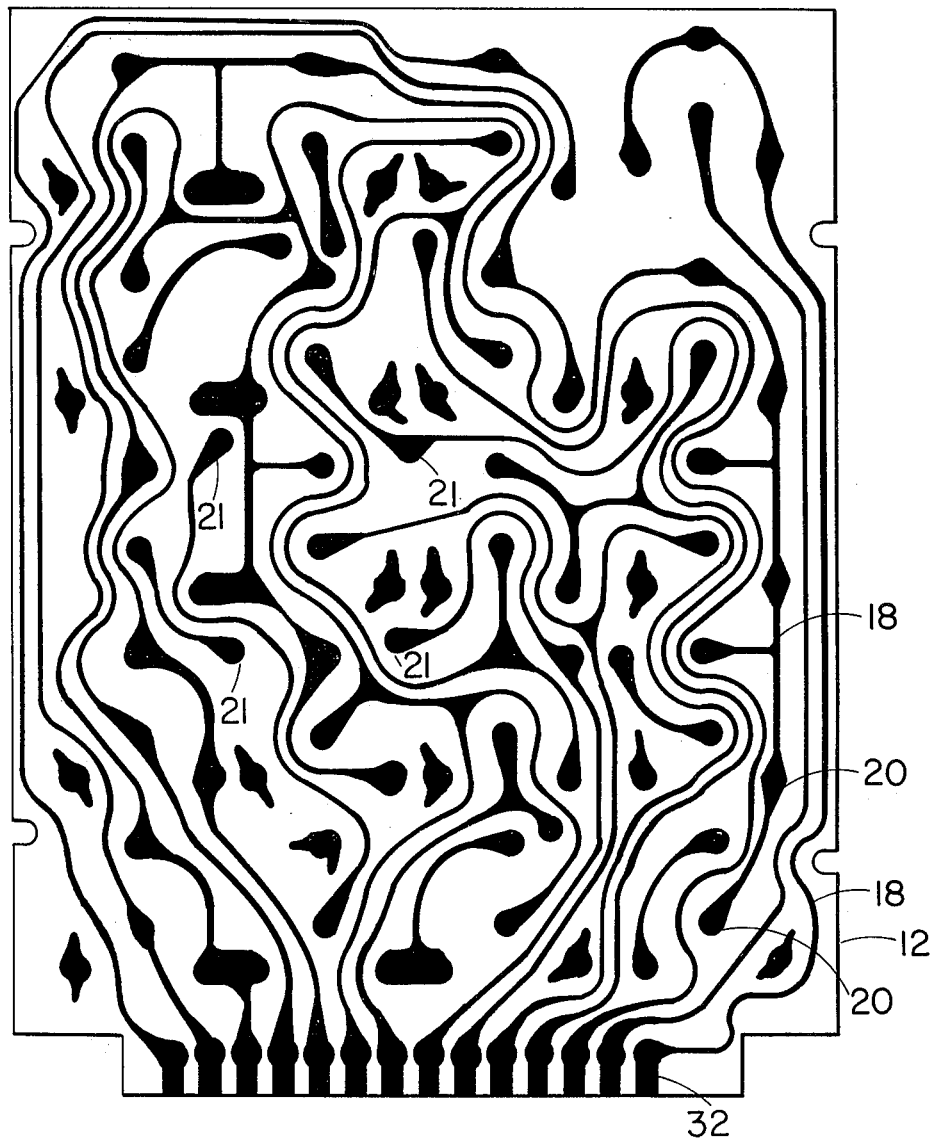
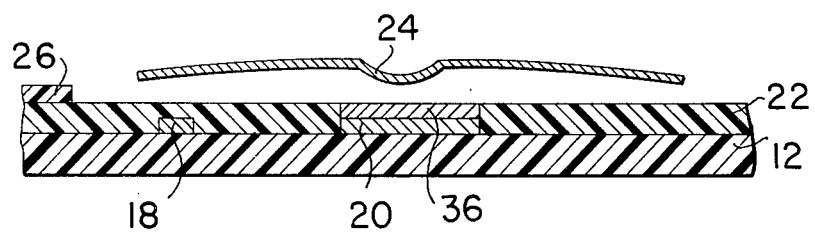
Fig. 2A

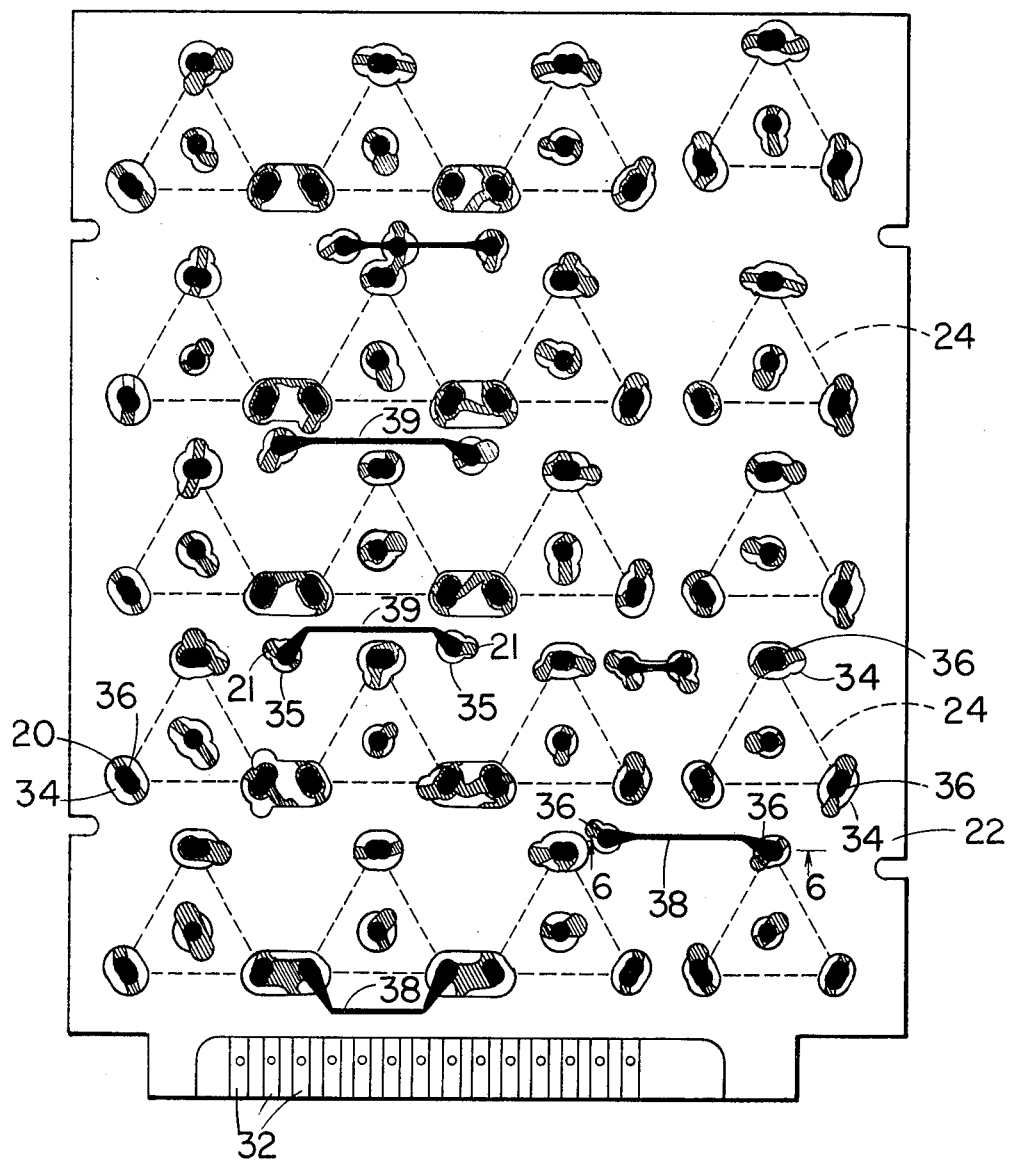
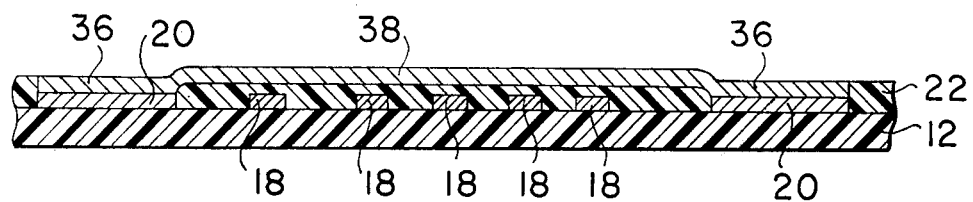

KEYBOARD SWITCH ASSEMBLY HAVING PRINTED CIRCUIT BOARD WITH PLURAL LAYER EXPOSED CONTACTS AND UNDERSURFACE JUMPER CONNECTIONS

BACKGROUND OF THE INVENTION

1. Field of the Invention

This invention relates generally to printed wiring boards and methods of making the same, and more particularly to a printed wiring board for a keyboard switch assembly and a method of making the same.

2. Description of the Prior Art

U.S. Pat. No. 3,796,843 to Durkee, et al, and assigned to the assignee of the present application discloses a keyboard switch assembly in which a complete X-Y matrix is provided with conductors on one side only of a printed wiring board by proportioning the switch elements so that certain of the conductors can extend under certain switch elements between respective terminal portions of other conductors.

In the fabrication of printed wiring boards for keyboard switch assemblies, such as that shown in the aforesaid Durkee, et al patent, it has been customary to provide switch contacts on the terminal portions of the copper conductors by gold plating over nickel in turn plated on the copper terminal portions, the nickel plating serving as a barrier between the copper and gold so as to inhibit migration of the gold into the copper at soldering temperatures. While such a construction provides entirely satisfactory switch contacts, it is obviously costly.

Further, even with the improved printed wiring board arrangement disclosed in the aforesaid Durkee, et al. patent, there are instances where it is desirable to provide connections between certain conductors which cannot be done without forming such connections on the reverse side of the board which in turn requires making connections through the board to the respective conductors thus adding appreciably to the overall cost of the board.

The fabrication of a printed wiring board by screen printing conductive ink traces or conductors on a surface of an insulator board is well known; however, it is difficult to make soldered connections to such conductive ink traces.

SUMMARY OF THE INVENTION

A keyboard switch assembly for electronic apparatus comprising an insulative member having a plurality of elongated conductors on one surface thereof, at least some of the conductors having terminal portions. Switch elements cooperate with the respective terminal portions. In accordance with the invention, each of the terminal portions has a coating of conductive ink thereon to provide a switch contact area. In accordance with a further aspect of the invention, a layer of insulating material covers the one surface of the board but excluding portions of the conductors, and an electrical jumper element formed of conductive ink is coated on the insulating layer crossing at least one of the conductors embedded therein and joining the exposed portions of at least two other ones of the conductors. The conductive ink is preferably a noble-metal filled resin compound, such as silver epoxy, screen printed on the insulating layer and the terminal portions. Thus, highly conductive switch contact areas are provided without the costly gold and nickel plating techniques previously employed, and jumper elements are provided on the same surface of the board as the conductors and terminal portions without necessitating the making of connections through the board, while the provision of copper conductors permits readily making soldered connections thereto.

The above-mentioned and other features and objects of this invention and the manner of attaining them will become more apparent and the invention itself will be best understood by reference to the following description of an embodiment of the invention taken in conjunction with the accompanying drawings.

BRIEF DESCRIPTION OF THE DRAWINGS

FIG. 2A is a fragmentary, enlarged cross-sectional view showing one of the switch elements of FIG. 2;

FIG. 3 is a top view of the pattern of conductors and terminal portions for the printed wiring board of FIGS. 1 and 2;

FIG. 5 is a top view of the board following application of the conductive ink coating to the exposed terminal portions shown in FIG. 4 and also showing the conductive ink jumper elements; and FIG. 6 is a fragmentary cross-sectional view taken generally along the line 6—6 of FIG. 5.

DESCRIPTION OF THE PREFERRED EMBODIMENT

Figure 1:
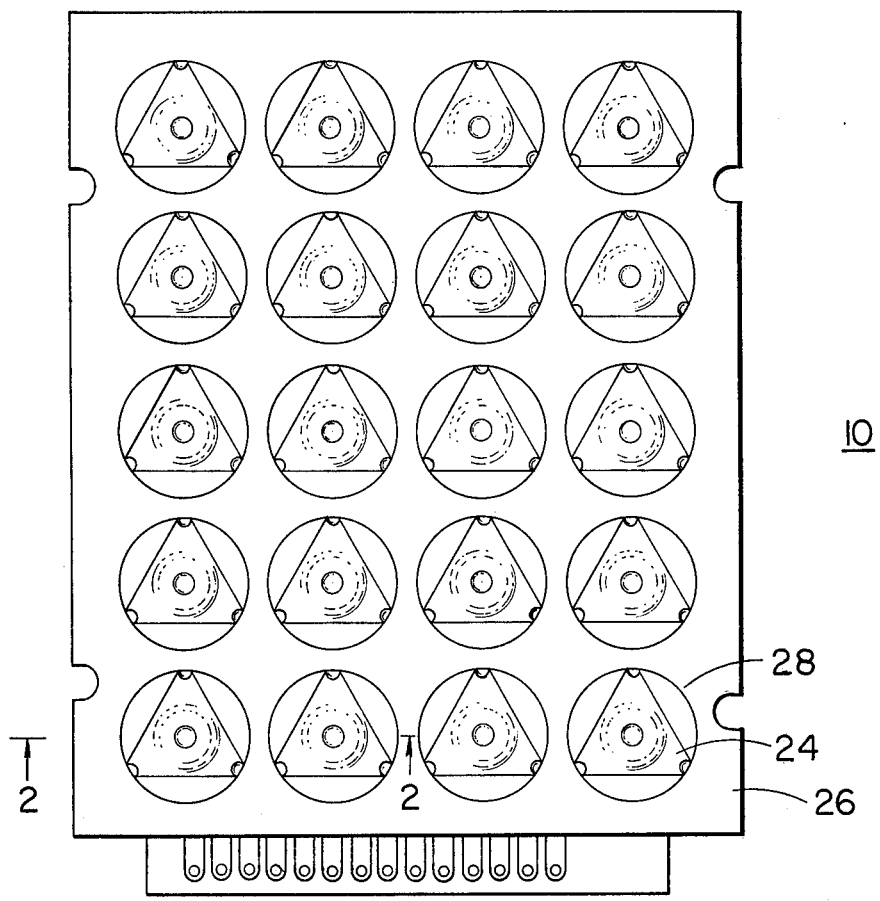
FIG. 1 is a top view of a keyboard switch assembly in accordance with the invention.
Figure 2:
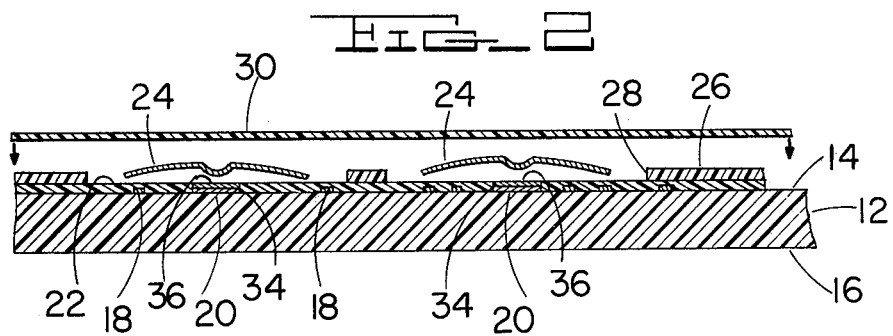
FIG. 2 is a cross-sectional view taken generally along the line 2—2 of FIG. 1.

Referring now to FIGS. 1 and 2 of the drawings, the improved keyboard switch assembly of the invention, generally indicated at 10, comprises a self-supporting, insulative board 12 having opposite solid surfaces 14, 16. A plurality of elongated (as opposed to conductive ink) copper conductors or traces 18 are adhered to one surface 14 of board 12, such as by conventional print and etch or die stamping techniques well known to those skilled in the art. At least some of the conductors 18 have enlarged portions 20, 21 thereon, portions 20 being switch terminals which cooperate with switch contact elements 24.

Surface 14 of board 12 and conductors 18 are coated by a thin coating 22 of insulative material however, portions 20, 21 are not so coated, i.e., remain exposed. Switch contact elements 24 cooperate with switch terminals 20. Retainer member 26 formed of a thin sheet of insulating material is adhered to insulative coating 22 and has openings 28 therein which accommodate switch elements 24. A thin sheet 30 of insulating material is applied over switch elements 24.

As thus far described, keyboard switch assembly 10 is generally of the type further described and illustrated in the aforesaid Durkee, et al. U.S. Pat. No. 3,796,843.

Figure 4:
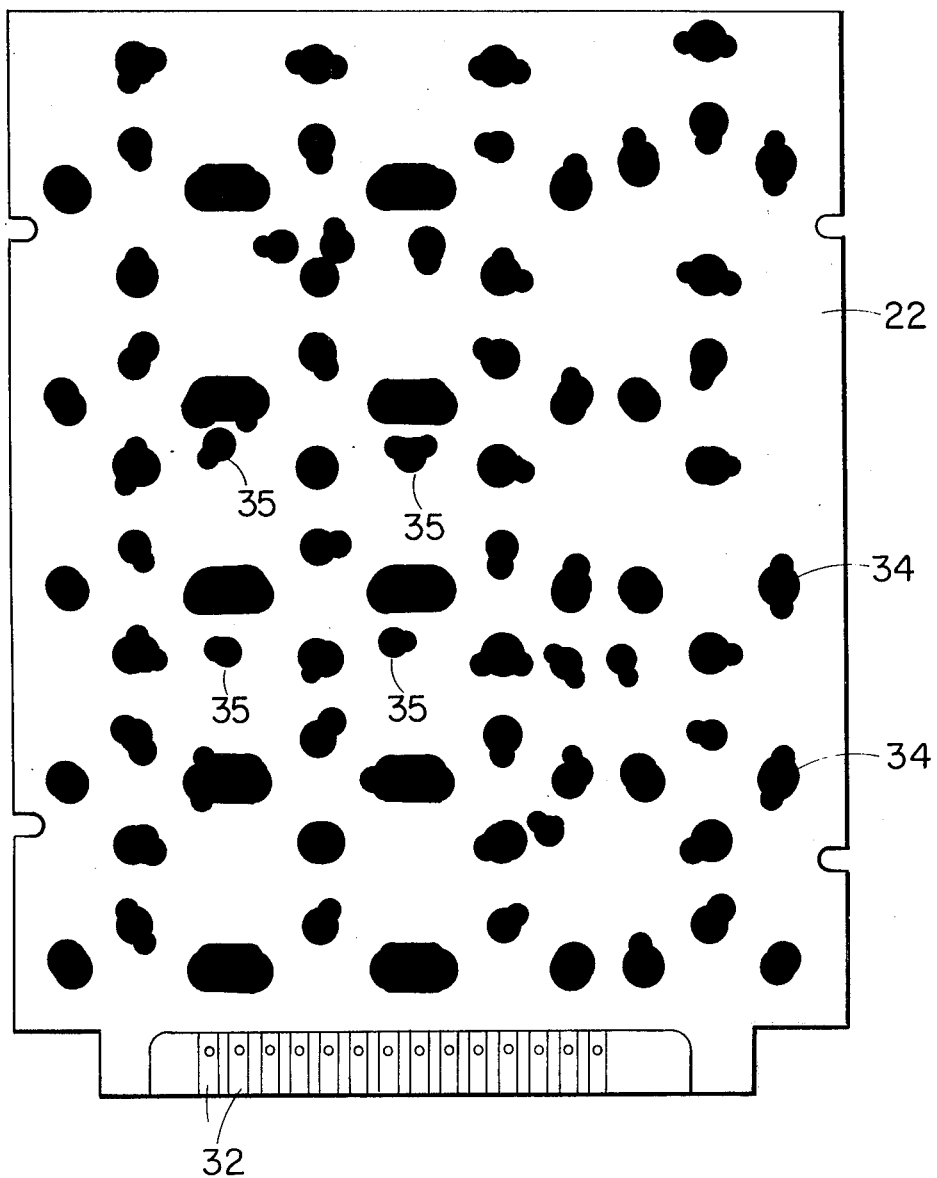
FIG. 4 is a top view of the board following application of the insulative coating to the conductor and terminal portion pattern of FIG. 3.

Referring now more particularly to FIG. 3 of the drawings, it will be seen that copper conductors 18 having enlarged portions 20 and 21 thereon are adhered to surface 14 of board 12 in a suitable pattern, conductors 18 terminating in external terminals 32 to which connections may be made. Referring now additionally to FIG. 4, insulative coating 22 is shown applied over surface 14 of board 12 and conductors 18 leaving uncoated areas 34 which expose portions 20 and areas 35 which expose portions 21.

Referring now to FIG. 5, conductive ink switch conduct areas 36 are coated on the exposed copper conductor portions 20, preferably by a conventional screen printing technique. In addition, jumper elements 38 and 39 formed of conductive ink are coated over insulative layer 22 crossing one or more conductors 18 embedded therein and joining selected switch contact areas 36, and conductor portions 21, respectively. The conductive ink coatings 36 and jumper elements 38, 39 are preferably applied at the same time in the same operation.

The conductive ink used to form switch contact areas 36 and jumpers 38 is preferably a noble-metal filled resin compound. While silver epoxy is preferred, other conductive material and resins may be employed. Conductive inks sold by Epoxy Technology Inc., 65 Grove ST., Watertown, Mass., under Catalogue Nos. EPO-TEK2 H31 and 417, and sold by Electro Science Labs Inc., 1601 Sherman Ave, Pennsuaken, NJ, under catalogue number ESL 1109-S have been found to be suitable for this application. The conductive ink described in U.S. Pat. No. 866, 764 would also be suitable for this application. It will be readily understood that in any given application, retainer member 26 and/or insulator 30 may be eliminated from the keyboard switch assembly 10.

It will now be readily seen that the provision of screen printed conductive ink switch contact areas 36 and jumpers 38, 39 eliminates the costly gold or nickel plating previously required and also permits making connections between conductors on the same side of the board without the necessity for making connection through the board to a conductor on the other side thereon.

While there have been described above the principles of this invention in connection with specific apparatus, it is to be clearly understood that this description is made only by way of example and not as a limitation to the scope of the invention.

What is claimed is:

1. In a keyboard switch assembly for electronic apparatus comprising an insulative member having opposite surfaces with a plurality of elongated solid metal conductors on one said surface thereof, at least some of said conductors having enlarged portions thereon, at least some of said enlarged portions being switch terminals, and switch elements cooperating with respective switch terminals; the improvement wherein each of said switch terminals has a coating of conductive ink thereon to provide a switch contact area.

2. The assembly of claim 1 wherein said conductors and enlarged portions are formed of copper, the conductive componentof said conductive ink being a noble metal.

3. The assembly of claim 2 wherein said conductive ink is a noble-metal filled resin compound.

4. The assembly of claim 3 wherein said noble metal is silver and said resin is epoxy.

5. The assembly of claim 1 further comprising a layer of insulating material having inner and outer surfaces with acid inner surface covering said one surface of said board and said conductors thereon excluding said enlarged portions of said conductors thereby exposing the same.

6. The assembly of claim 5 further comprising an electrical jumper element formed of conductive ink coated on said outer surface of said insulating layer crossing at least one of said conductors covered thereby and joining said exposed enlarged portions of at least two other ones of said conductors.

7. The assembly of claim 6 wherein said enlarged portions include said switch terminals, said jumper element being joined to at least one of said switch terminal coatings.

8. The assembly of claim 7 wherein said exposed enlarged portions also include other enlarged portions of certain of said conductors other than said switch terminals, and further comprising another jumper element formed of conductive ink coated on said outer suface of said insulating layer crossing at least one other of said conductors covered thereby and joined to at least one of said other exposed enlarged portions.

9. In a keyboard switch assembly for electronic apparatus comprising an insulative member having opposite surfaces with a plurality of elongated solid metal conductors on one said surface thereof, at least some of said conductors having enlarged portions thereon, a layer of insulating material having inner and outer surfaces with said inner surface covering said one surface of said member and said conductors thereon excluding said enlarged portions thereby exposing the same, and switch elements cooperating with certain of said enlarged portions; the improvement comprising an electrical jumper element formed of conductive ink coated on said outer surface of said insulative layer crossing at least one of said conductors covered thereby and joining said exposed portions of at least two other ones of said conductors.

10. The assembly of claim 9 wherein said jumper element is joined to at least one of said exposed portions which cooperates with said switch element.

11. The assembly of claim 10 further comprising another jumper element formed of conductive ink coated on said outer surface of said insulative layer crossing at least one other of said conductors covered thereby and joining said exposed portions of at least two other ones of said conductors, at least one of said last-named exposed portions being other than one which cooperates with a switch element.

* * * * *

UNITED STATES PATENT AND TRADEMARK OFFICE
CERTIFICATE OF CORRECTION

PATENT NO. : 4,045,636
DATED : August 30, 1977
INVENTOR(S) : Alan C. Yoder

It is certified that error appears in the above-identified patent and that said Letters Patent are hereby corrected as shown below:

Col. 2, lines 40, 41 & 42 should read:

-- insulative board 12 having opposite surfaces 14, 16. A plurality of elongated solid copper (as opposed to conductive ink) conductors or traces 18 are adhered to one *** --

Col. 3, line 23  Change " 866,764" to -- 2,866,764 --

Claim 5, line 7,  "acid" should be -- said --
Claim 7, line 1   -- exposed -- should be inserted ahead of "enlarged"

Signed and Sealed this

Fourteenth Day of February 1978

[SEAL]

Attest:

RUTH C. MASON
*Attesting Officer*

LUTRELLE F. PARKER
*Acting Commissioner of Patents and Trademarks*